Dec. 12, 1961 H. C. GORTON ET AL 3,013,193

COMPOUND SEMICONDUCTOR DEVICES

Filed Jan. 11, 1960

INVENTORS
HENRY CLAY GORTON
WILBUR L. MEFFERD
ROBERT K. WILLARDSON

BY Gray, Mase & Dunson, Attorneys 3,013,193

COMPOUND SEMICONDUCTOR DEVICES

Henry Clay Gorton, Hilliards, and Wilbur L. Mefferd and Robert K. Willardson, Columbus, Ohio, assignors, by mesne assignments, to The Battelle Development Corporation, Columbus, Ohio, a corporation of Delaware Filed Jan. 11, 1960, Ser. No. 1,459
5 Claims. (Cl. 317—237)

This invention relates to a semiconductor for electrical devices such as resistors, rectifiers, amplifiers, detectors, control devices, generators, photo cells, thermoelectric devices, galvanomagnetic devices, and the like. The new semiconductor provides distinct advantage over those developed and employed in the past.

Figure 1:
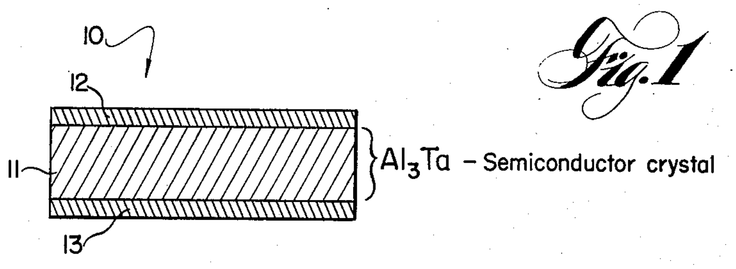
FIG. 1 is a cross-sectional view of a typical semiconductor device according to the present invention.

During the last several years, semiconducting materials, particularly crystalline materials of the fourth group of the periodic table and of compounds comprising elements of groups $III_B$ and $V_B$, have become important as components for the generation and control of electrical currents and in the detection and transmission of electromagnetic radiation. Such materials are described at length in the technical literature and are the subject of a number of patents. Of these, the total number of useful materials available is small and the range of usefulness of each in semiconductor devices is rather limited.

The present invention provides new and useful semiconductor devices comprising the novel compound aluminum tantalide (trialuminum tantalide, $Al_3Ta$), a material not heretofore considered for semiconductor devices.

The compound $Al_3Ta$ was produced and was identified by X-ray crystallography. It is a refractory compound and has a body-centered tetragonal crystal structure. The melting point is about 1700° C. It has been produced by precipitation from an aluminum solution of tantalum. Single crystal whiskers of the compound, grown on sintered material, are transparent, which is a characteristic of a high band gap material. The resistivity of the compound is in the useful range for semiconductor applications. In particular, a resistivity of 3 ohm-cm. was measured on one sample.

The general conditions required for a semiconductor are that the material have a valence band essentially filled with electrons and a conduction band essentially depleted of electrons at absolute zero. The energy difference between the top of the valence band and the bottom of the conduction band should be great enough to limit the number of intrinsic carriers that are excited at normal temperatures. A semiconductor may have localized states lying between the valence and conduction bands capable of either capturing an electron from the valence band, or giving up an electron to the conduction band by thermal excitation, giving rise to extrinsic conduction. Because of the relatively few electrons in the conduction band at normal temperatures, the resisivity of semiconductors is generally greater than the resisivity of materials classed as metals (less than about $10^{-4}$ ohm-cm.), but not so great as the resistivity of insulators (greater than about $10^6$ ohm-cm.). Also, as the temperature of a semiconductor increases, the number of electrons that are thermally excited from the valence band, or from localized states, to the conduction band increases, giving rise to a negative temperature coefficient of resistance. This is opposed to a positive temperature coefficient of resistance characteristic of metals. Semiconducting properties of $Al_3Ta$ are shown by its resistivity which in at least one case was about 3 ohm-cm.

$Al_3Ta$ may be produced by dissolving up to 25 atomic percent tantalum in aluminum at temperatures up to 1700° C. and then slowly cooling the melt, precipitating the compound $Al_3Ta$. It may also be made by direct reaction of the components at the melting point of the compound. Care must be taken to maintain stoichiometry. If the aluminum-tantalum solution were heated to a temperature higher than the melting point of $Al_3Ta$, and subsequently cooled, the compound AlTa would precipitate from the melt until the solidification temperature of $Al_3Ta$ were reached.

The compound has been produced by adding from 0.5 to 5 atomic percent of tantalum to aluminum, heating to 1000° C. for several hours to allow the tantalum to dissolve, and cooling the solution at the rate of 2 centigrade degrees per minute. The $Al_3Ta$ is recovered by dissolving the aluminum in hydrochloric acid. Under certain conditions the $Al_3Ta$ forms a dendritic structure. The resistivities of several crystals of $Al_3Ta$ have been measured with an arrangement using two current contacts and two potential probes and found to be in the range of 1–10 ohm-cm. A sample comprised of fine particles of $Al_3Ta$ recovered from a tantalum-aluminum melt was heated and observed to melt at about 1700° C. After the melt had cooled, single crystal whiskers that had grown from the surface of the material were observed to be transparent.

One of the characteristics of semiconductor crystals of relatively high resistivity, such as silicon, germanium, and $III_B$–$V_B$ compounds, is that through homopolar bonding, valence electrons form closed shells around the atoms of the crystal. This fulfills the condition that at absolute zero the valence band is full of electrons and the conduction band empty, and, together with appreciable band gaps in the materials, give rise to the relatively high resistivities of the materials.

The homopolar bonding mechanism in $Al_3Ta$ which is expected to a considerable degree because of the location of its constituent elements in the periodic table allows for the sharing of three valence electrons from each of the three aluminum atoms for each tantalum atom, which has five valence electrons available for sharing. This situation allows the possibility of a closed shell for one of the aluminum atoms, but not for the tantalum atom or the other two aluminum atoms. Thus, at absolute zero the valence band would not be filled, and current carriers therein would be available for the conduction process. Consequently, it was to be expected that the conductivity of $Al_3Ta$ would be high. Also, in the heavier elements such as tantalum the energy difference between the outer electron bands is much lower than in the lighter elements, which would also be expected to contribute to high conductivity. For these reasons, $Al_3Ta$ has never been considered as a likely semiconductor material. As discussed above, however, it has been discovered in the present invention that $Al_3Ta$ does possess the useful properties required in semiconductor devices.

A semiconductor device according to this invention comprises a crystalline body and electrical connecting means in contact therewith, the body consisting essentially of the compound $Al_3Ta$. At least a portion of the compound body may contain a trace of donor impurity and have n-type conductance because of the presence of such impurity. Similarly, at least a portion of the compound body may contain a trace of acceptor impurity and have p-type conductance because of the presence of such impurity. The body may have a plurality of zones of different electrical conductance. In the different zones, at least one zone may contain in the compound a trace of acceptor impurity and thus have p-type conductance and at least one other zone may contain in the compound a trace of donor impurity and thus have n-type conductance.

Referring now to FIG. 1, a typical semiconductor device 10, according to the present invention, comprises a body 11 made of a semiconductor crystal consisting essentially of the compound $Al_3Ta$. A conductor 12 made of any suitable metal or other electrically conductive material is connected to the upper surface of the semiconductor body 11. A conductor 13 made of any suitable metal or other electrically conductive material is connected to the lower surface of the semiconductor body 11.

Figure 2:
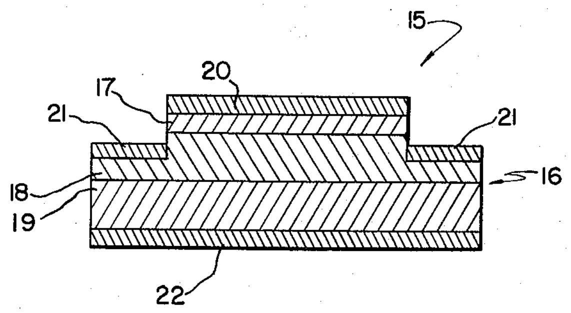
FIG. 2 is a cross-sectional view of another typical semiconductor device according to the present invention.

FIG. 2 illustrates another typical semiconductor device according to the present invention. In this device 15, a body 16 is made of a semiconductor crystal consisting essentially of the compound $Al_3Ta$. The semiconductor body 16 includes an upper zone 17 having one type of conductivity, a middle zone 18 having conductivity of the type opposite from that of the upper zone 17, and a lower zone 19 having conductivity of the type opposite to that of the adjacent zone 18 and of course of the same type as the conductivity of the upper zone 17. A conductor 20 is connected to the upper surface of the upper zone 17, conductors 21 are connected to a surface of the middle zone 18, and a conductor 22 is connected to the lower surface of the lower zone 19.

In one form of the device 15, the upper zone 17 of the body 16 has p-type conductivity, the middle zone 18 has n-type conductivity, and the lower zone 19 has p-type conductivity. An example of such a device is a p-n-p junction transistor. In another form of the device 15, the upper zone 17 of the semiconductor body 16 has n-type conductivity, the middle zone 18 has p-type conductivity and the lower zone 19 has n-type conductivity. An example of such a device is an n-p-n junction transistor. In the p-n-p semiconductor device, the upper zone 17 and the lower zone 19 each contain in the semiconductor compound a trace of acceptor impurity, while the middle zone 18 contains a trace of donor impurity. In the n-p-n device, the upper zone 17 and the lower zone 19 each contain a trace of donor impurity, and the middle zone 18 contains a trace of acceptor impurity in the semiconductor compound.

Figure 3:
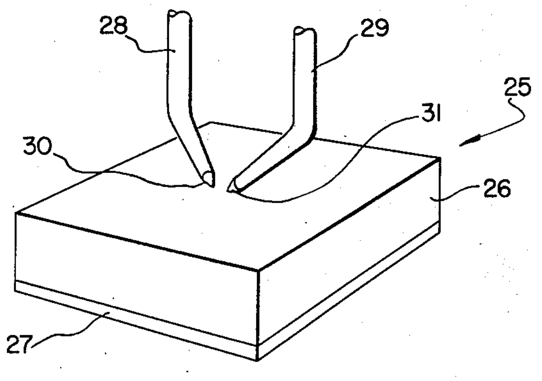
FIG. 3 is a perspective view of still another typical semiconductor device according to the present invention.

FIG. 3 shows a typical form of point contact semiconductor device according to the present invention. In this device 25, a semiconductor body 26 consists essentially of the compound $Al_3Ta$. A conductor 27 is connected to the lower surface of the semiconductor body 26. Conductors 28 and 29, having sharp pointed ends 30 and 31, respectively, are connected to the upper surface of the semiconductor body 26, with the pointed ends 30 and 31 contacting the semiconductor body 26 in close proximity to each other. An example of this type of device is a point contact transistor.

The drawings are merely illustrative of the many shapes and forms that a semiconductor device according to the present invention may have and are not intended to limit the invention in any way.

What is claimed is:

1. A semiconductor device comprising a crystalline body and electrical connecting means in contact therewith, said body consisting essentially of the compound $Al_3Ta$.

2. A semiconductor device according to claim 1, at least a portion of said compound body containing a trace of donor impurity and having n-type conductance because of the presence of said impurity.

3. A semiconductor device according to claim 1, at least a portion of said compound body containing a trace of acceptor impurity and having p-type conductance because of the presence of said impurity.

4. A semiconductor device comprising a crystalline body and electrical connecting means in contact therewith, said body consisting essentially of the compound $Al_3Ta$, said body having a plurality of zones of different electrical conductance.

5. A semiconductor device according to claim 4, at least one said zone containing in said compound a trace of acceptor impurity and having p-type conductance and at least one other said zone containing in said compound a trace of donor impurity and having n-type conductance.

References Cited in the file of this patent

UNITED STATES PATENTS

| | | |
|---|---|---|
| 2,719,253 | Willardson et al. | Sept. 27, 1955 |
| 2,754,456 | Madelung | July 10, 1956 |